United States Patent
Soman et al.

(10) Patent No.: US 9,304,283 B2
(45) Date of Patent: Apr. 5, 2016

(54) BOND-PAD INTEGRATION SCHEME FOR IMPROVED MOISTURE BARRIER AND ELECTRICAL CONTACT

(71) Applicant: Texas Instruments Incorporated, Dallas, TX (US)

(72) Inventors: Joel Soman, Dallas, TX (US); Neng Jiang, Plano, TX (US); Scott Summerfelt, Garland, TX (US); Thomas Warren Lassiter, Garland, TX (US); Nayeemuddin Mohammed, Plano, TX (US); Mary Alyssa Drummond Roby, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/533,967

(22) Filed: Nov. 5, 2014

(65) Prior Publication Data

US 2015/0338604 A1    Nov. 26, 2015

Related U.S. Application Data

(60) Provisional application No. 62/018,785, filed on Jun. 30, 2014, provisional application No. 61/001,807, filed on May 22, 2014.

(51) Int. Cl.
  *G02B 7/09* (2006.01)
  *H01L 21/3213* (2006.01)
  *H04N 5/232* (2006.01)
  *C23F 1/00* (2006.01)

(52) U.S. Cl.
  CPC ... *G02B 7/09* (2013.01); *C23F 1/00* (2013.01); *H01L 21/32136* (2013.01); *H01L 21/32139* (2013.01); *H04N 5/232* (2013.01); *H04N 5/23229* (2013.01)

(58) Field of Classification Search
  None
  See application file for complete search history.

(56) References Cited

U.S. PATENT DOCUMENTS

| | | | |
|---|---|---|---|
| 6,407,422 B1 * | 6/2002 | Asano | H01L 28/75 257/296 |
| 8,279,541 B2 | 10/2012 | Henderson et al. | |
| 8,309,999 B2 * | 11/2012 | Wang | H01L 27/11502 257/306 |
| 8,872,306 B2 * | 10/2014 | Jin | H01L 23/5256 257/529 |
| 9,064,936 B2 * | 6/2015 | Lin | H01L 21/3836 |
| 9,082,820 B2 * | 7/2015 | Shimotsusa | H01L 21/768 |

(Continued)

FOREIGN PATENT DOCUMENTS

WO    WO2012/003529 A1    1/2012

*Primary Examiner* — Michael Osinski
(74) *Attorney, Agent, or Firm* — Jacqueline J. Garner; Frank D. Cimino (57) ABSTRACT

An apparatus includes first and second electrodes separated by an insulative material (such as a piezoelectric material). The apparatus also includes a protective layer over the first and second electrodes. The protective layer has a first opening that exposes a portion of the first electrode and a second opening that exposes a portion of the second electrode. The apparatus further includes a first electrical contact at least partially within the first opening and electrically coupled to the first electrode. In addition, the apparatus includes a second electrical contact at least partially within the second opening and electrically coupled to the second electrode. Each of the first and second electrical contacts includes a stack of metal layers. The stack of metal layers includes a titanium nitride layer, a titanium layer over the titanium nitride layer, and an aluminum copper layer over the titanium nitride layer and the titanium layer.

20 Claims, 6 Drawing Sheets

(56) References Cited

U.S. PATENT DOCUMENTS

| | | | | |
|---|---|---|---|---|
| 2002/0140003 | A1* | 10/2002 | Mizobuchi | H01L 27/14806 257/215 |
| 2003/0222299 | A1* | 12/2003 | Miura | H01L 21/31053 257/306 |
| 2004/0155278 | A1* | 8/2004 | Natori | C23C 14/08 257/306 |
| 2006/0231880 | A1* | 10/2006 | Yamakawa | H01L 27/11502 257/306 |
| 2007/0184578 | A1* | 8/2007 | Lin | H05K 3/3452 438/106 |
| 2008/0143664 | A1* | 6/2008 | Nakagawa | G02F 1/1368 345/92 |
| 2009/0267185 | A1* | 10/2009 | Osada | H01L 23/5223 257/532 |
| 2011/0298021 | A1* | 12/2011 | Tada | H01L 21/02126 257/288 |
| 2012/0126421 | A1* | 5/2012 | Lee | H01L 21/76816 257/774 |
| 2012/0256319 | A1* | 10/2012 | Mitsuhashi | H01L 21/14634 257/774 |
| 2013/0057699 | A1* | 3/2013 | Ooki | H01L 27/14621 348/164 |
| 2013/0082341 | A1* | 4/2013 | Shimizu | H01L 27/14636 257/431 |
| 2013/0087682 | A1* | 4/2013 | Nomura | C09B 23/105 250/206 |
| 2015/0054113 | A1* | 2/2015 | Suzuki | H01L 27/14638 257/459 |
| 2015/0228806 | A1* | 8/2015 | Yamamoto | H01L 29/66106 257/618 |
| 2015/0295092 | A1* | 10/2015 | Misaki | G02F 1/1368 257/43 |

* cited by examiner

BOND-PAD INTEGRATION SCHEME FOR IMPROVED MOISTURE BARRIER AND ELECTRICAL CONTACT

CROSS-REFERENCE TO RELATED APPLICATIONS AND PRIORITY CLAIM

This application claims priority under 35 U.S.C. §119(e) to the following U.S. provisional patent applications:

U.S. Provisional Patent Application No. 62/018,785 filed on Jun. 30, 2014; and

U.S. Provisional Patent Application No. 62/001,807 filed on May 22, 2014.

Both of these provisional patent applications are hereby incorporated by reference in their entirety.

TECHNICAL FIELD

This disclosure is generally directed to electrical circuits. More specifically, this disclosure is directed to a bond-pad integration scheme for providing improved moisture barrier and electrical contact.

BACKGROUND

Bond pads are often used to form electrical connections to circuits. For example, a bond pad could be formed from copper, gold, or other metals, and an electrical connection can be formed between the bond pad and a circuit. The circuit can then be electrically coupled to an external device by forming an electrical connection between the external device and the bond pad. Often times, bond pads are positioned in locations where it is easier or more convenient to form electrical connections with an external device.

SUMMARY

This disclosure provides a bond-pad integration scheme for providing improved moisture barrier and electrical contact.

In a first embodiment, an apparatus includes first and second electrodes separated by an insulative material (such as a piezoelectric material). The apparatus also includes a protective layer over the first and second electrodes. The protective layer has a first opening that exposes a portion of the first electrode and a second opening that exposes a portion of the second electrode. The apparatus further includes a first electrical contact at least partially within the first opening and electrically coupled to the first electrode. In addition, the apparatus includes a second electrical contact at least partially within the second opening and electrically coupled to the second electrode. Each of the first and second electrical contacts includes a stack of metal layers. The stack of metal layers includes a titanium nitride layer, a titanium layer over the titanium nitride layer, and an aluminum copper layer over the titanium nitride layer and the titanium layer.

In a second embodiment, a system includes an auto-focus lens having a lens material forming a lens and a driver configured to change a shape of the lens material in order to change a focus of the lens. The auto-focus lens also includes first and second electrodes separated by an insulative piezoelectric material. The insulative piezoelectric material is configured to change the shape of the lens material in response to a voltage across the first and second electrodes. The auto-focus lens further includes a protective layer over the lens material and over the first and second electrodes. The protective layer has a first opening that exposes a portion of the first electrode and a second opening that exposes a portion of the second electrode. In addition, the auto-focus lens includes a first electrical contact at least partially within the first opening and electrically coupled to the first electrode and to the driver and a second electrical contact at least partially within the second opening and electrically coupled to the second electrode and to the driver. Each of the first and second electrical contacts includes a stack of metal layers. The stack of metal layers includes a titanium nitride layer, a titanium layer over the titanium nitride layer, and an aluminum copper layer over the titanium nitride layer and the titanium layer.

In a third embodiment, a method includes forming a stack of metal layers over multiple electrodes and over a protective layer of a device. The protective layer has a first opening that exposes a portion of the first electrode and a second opening that exposes a portion of the second electrode. The method also includes etching the stack of metal layers to form (i) a first electrical contact at least partially within the first opening and electrically coupled to the first electrode and (ii) a second electrical contact at least partially within the second opening and electrically coupled to the second electrode. The stack of metal layers includes a titanium nitride layer, a titanium layer over the titanium nitride layer, and an aluminum copper layer over the titanium nitride layer and the titanium layer.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
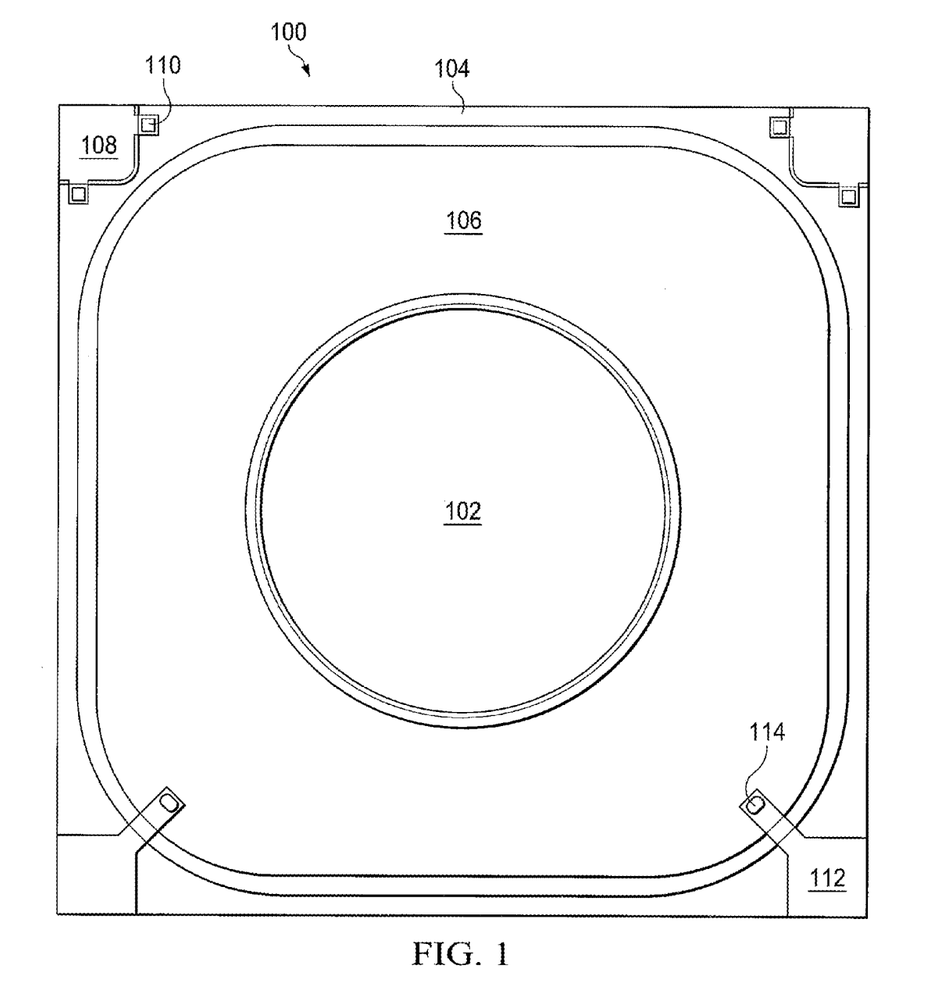
FIGS. 1 through 3 illustrate an example auto-focus lens and related details in accordance with this disclosure.
Figure 2A:
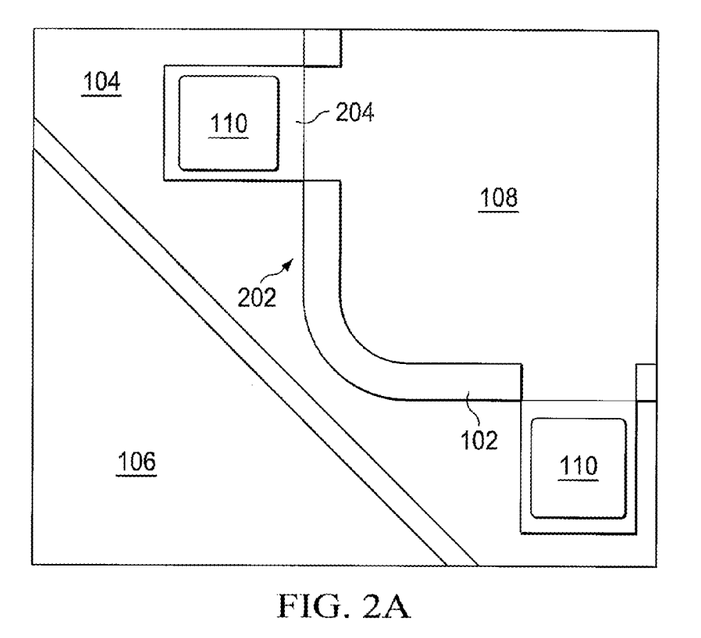
Figure 2B:
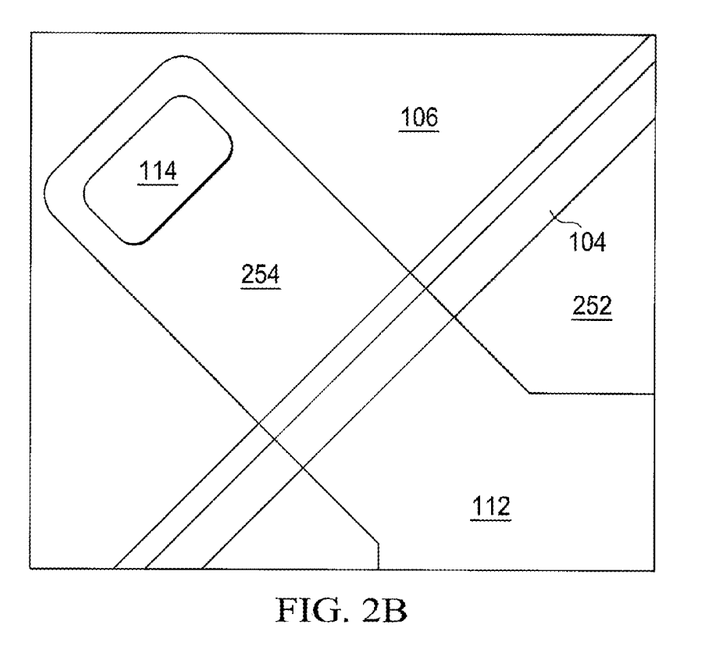
Figure 3:
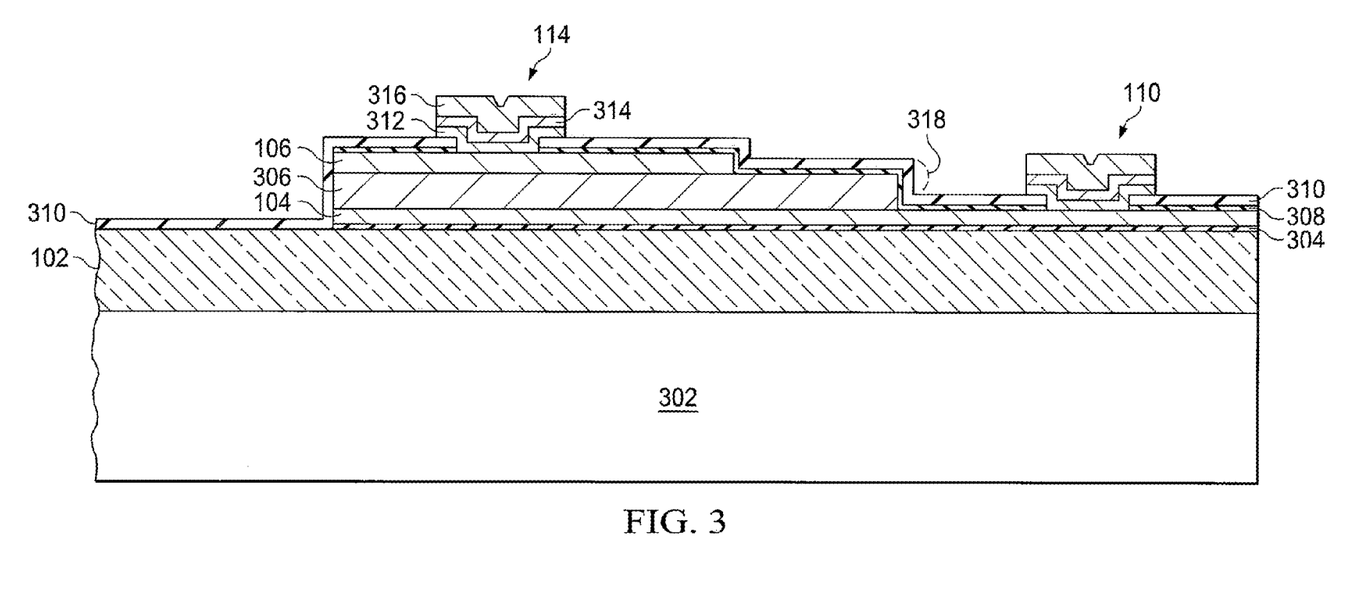

FIGS. 1 through 3 illustrate an example auto-focus lens 100 and related details in accordance with this disclosure. More specifically, FIG. 1 illustrates a top view of an example auto-focus lens 100, FIGS. 2A and 2B illustrate example bond pads used with the auto-focus lens 100, and FIG. 3 illustrates a side view of part of the auto-focus lens 100.

As shown in FIG. 1, the auto-focus lens 100 generally represents a micro-electromechanical system (MEMS) device that includes lens material 102, a bottom electrode 104, and a top electrode 106. The lens material 102 generally represents any suitable material or combination of materials that is partially or fully transparent to one or more wavelengths of interest. For example, the lens material 102 could represent glass, such as borophosphosilicate glass (BPSG). The lens material 102 forms a lens that can be deformed by applying a voltage across the electrodes 104-106, which changes the focus of the lens. The lens material 102 could include any suitable material(s) and can be formed in any suitable manner, such as via deposition on a silicon or other underlying substrate (at least part of which is later removed).

Each electrode 104-106 represents a conductive structure that can be electrically coupled to an external driver or other component(s). The electrodes 104-106 are separated by at least one piezoelectric material (which is also insulative) to thereby form a piezoelectric capacitor. A voltage applied across the electrodes 104-106 causes the piezoelectric material to bend, which causes the lens material 102 to bend and change the focus of the lens formed by the lens material 102. Each electrode 104-106 can be formed from any suitable conductive material(s), such as platinum, nickel, palladium, or other metal(s). Each electrode 104-106 could also be formed in any suitable manner, such as via metal deposition followed by an etch process.

One or more bond pads 108 are each electrically coupled to one or more electrical contacts 110, which provide electrical connection to the electrode 104. Similarly, one or more bond pads 112 are each electrically coupled to one or more electrical contacts 114, which provide electrical connection to the electrode 106. The bond pads 108, 112 provide a mechanism for electrically coupling the auto-focus lens 100 to an external device or system, such as a camera or video recorder.

Each bond pad 108, 112 generally includes any suitable conductive structure formed from any suitable material(s), such as one or more metals. Each bond pad 108, 112 could also be formed in any suitable manner, such as via metal deposition followed by an etch process. As described in more detail below, each electrical contact 110, 114 could be formed using a metal stack that includes an aluminum copper (AlCu) layer, a titanium (Ti) layer, and a titanium nitride (TiN) layer. The titanium and titanium nitride layers in the stack could also be etched using the high-temperature isotropic plasma etching process described below.

Note that the layout, numbers, and shapes of the various components shown in FIG. 1 are for illustration only and that other layouts, numbers, and shapes could be used. For example, the electrode 106 could be larger than the electrode 104, or the electrodes 104-106 could have substantially identical sizes and shapes. As a particular example, the electrodes 104-106 could both have circular outer perimeters and circular apertures, and the sizes of the electrodes 104-106 may or may not be identical. As another example, the numbers, positions, and shapes of the bond pads 108, 112 and electrical contacts 110, 114 are for illustration only.

FIGS. 2A and 2B illustrate the bond pads 108, 112 and the electrical contacts 110, 114 of the auto-focus lens 100 in greater detail. As shown in FIGS. 1 and 2A, each bond pad 108 is generally square or rectangular with one or more rounded corners, and each bond pad 108 at least partially resides within a window 202 through the electrode 104. Each window 202 could be formed through the material of the electrode 104, or the electrode 104 could be formed having the windows 202. Each window 202 exposes a portion of the underlying lens material 102. Each bond pad 108 includes two lateral extensions 204 that electrically couple that bond pad 108 to two electrical contacts 110. The lateral extensions 204 could extend from one or more sides of a bond pad 108 or extend over and be coupled to an underlying bond pad 108 (such as through the use of conductive vias). The lateral extensions 204 could be coupled to the electrical contacts 110 in any suitable manner, such as by using conductive vias or conductive epoxy.

As shown in FIGS. 1 and 2B, each bond pad 112 is generally square or rectangular, and each bond pad 112 at least partially resides within a window 252 through the electrode 104. Again, each window 252 exposes a portion of the underlying lens material 102. Each bond pad 112 includes a lateral extension 254 that electrically couples that bond pad 112 to one electrical contact 114. The lateral extension 254 could extend from one or more sides of a bond pad 112 or extend over and be coupled to an underlying bond pad 112 (such as through the use of one or more conductive vias). The lateral extension 254 could also be coupled to the electrical contact 112 in any suitable manner, such as by using conductive vias or conductive epoxy.

Note that the bond pads 108, 112 could have any other suitable shape(s) or location(s). For example, the use of square or rectangular bond pads with rounded corners is for illustration only, and other shapes could be used. As another example, the use of windows 202, 252 through the electrode 104 is not required, and the bond pads 108, 112 could be positioned elsewhere, such as over the electrode 104 (with at least one insulative material between the bond pads 108, 112 and the electrodes 104-106).

FIG. 3 illustrates a side view of a portion of the auto-focus lens 100. Note that while the electrical contacts 110 and 114 appear to be side-by-side in FIG. 3, the electrical contacts 110 and 114 could reside at different corners or other locations of the auto-focus lens 100. As shown in FIG. 3, the lens material 102 is disposed on a substrate 302, such as a silicon wafer or other substrate. All or a portion of the substrate 302 can be removed during subsequent "backend" processing to expose the lens material 102 after various structures have been formed on top of or over the lens material 102 in FIG. 3.

As can be seen in FIG. 3, a layer 304 separates the lens material 102 from the electrode 104. The layer 304 represents a seeding layer that facilitates formation of the layer(s) of material(s) used to form the bottom electrode 104 on the lens material 102, helping to improve adhesion of the bottom electrode 104 to the lens material 102. Also, a piezoelectric layer 306 separates the electrodes 104-106 from one another, thereby forming a piezoelectric capacitor. As noted above, the piezoelectric layer 306 can change shape based on voltage applied across the electrodes 104-106 to change the shape of the lens material 102. The piezoelectric layer 306 includes any suitable piezoelectric material(s), such as lead zirconium titanate (PZT).

Two layers 308-310 are formed over the lens material 102 and the electrodes 104-106. The layer 308 denotes one or more layers of material(s) that help to reduce or prevent hydrogen penetration into the piezoelectric layer 306. The layer 308 includes any suitable material(s) that help to block hydrogen penetration, such as alumina ($Al_2O_3$). The layer 308 could also be formed in any suitable manner, such as by using atomic layer deposition (ALD).

The protective layer 310 represents one or more layers, such as a protective oxide (PO) layer, that help to reduce or prevent moisture penetration into the piezoelectric layer 306 or the layer 308. The protective layer 310 also helps to protect the underlying layers, such as the lens material 102. The protective layer 310 could further function as an anti-reflective coating (ARC) layer during subsequent fabrication steps. The protective layer 310 could be formed from any suitable material(s), such as one or more oxides. As a particular example, the protective layer 310 could include a stack containing two silicon dioxide ($SiO_2$) layers separated by a silicon oxinitride (SiON) layer, although the number of $SiO_2$, SiON, or other oxide layers could vary. The protective layer 310 could also be formed in any suitable manner.

In many conventional approaches, openings would be formed through the two layers 308-310 to expose portions of the underlying electrodes 104-106, and metal or other conductive material(s) would be deposited in the openings to form electrical connections to the electrodes 104-106. However, various implementations of the auto-focus lens 100 suffer from particular problems if these conventional approaches are used. For example, if the electrodes 104-106 are formed using platinum, platinum forms a very poor hermetic seal, which allows moisture to leak into the capacitive stack (including the piezoelectric layer 306). Materials used to form the piezoelectric layer 306 (such as PZT) can be highly sensitive to moisture ingress, which could significantly reduce the breakdown voltage $V_{BD}$ of the capacitor formed by the electrodes 104-106 and the piezoelectric layer 306.

To help solve these problems, each of the electrical contacts 110, 114 in FIG. 3 is implemented using a stack of metal layers 312-316. The layer 312 denotes a titanium nitride layer, the layer 314 denotes a titanium layer, and the layer 316 denotes an aluminum copper layer. In particular embodiments, the titanium nitride layer 312 could have a thickness of about 1000 Å, the titanium layer 314 could have a thickness of about 1000 Å, and the aluminum copper layer 316 could have a thickness of about 6000 Å.

In this approach, the titanium nitride layer 312 can function as a moisture barrier. The moisture barrier formed by the titanium nitride layer 312 substantially blocks moisture from passing into the piezoelectric layer 306 through the openings in the layers 308-310. This can significantly increase the breakdown voltage $V_{BD}$ of the capacitor formed by the electrodes 104-106 and the piezoelectric layer 306.

Moreover, if only titanium nitride is used to form the electrical contacts to the electrodes 104-106, an oxide film could form on the titanium nitride. This oxide film could substantially interfere with proper operation of the auto-focus lens 100. The presence of the titanium layer 314 and the aluminum copper layer 316 help to prevent this oxide film from forming on the titanium nitride layer 312.

Further, the aluminum copper layer 316 provides an electrical surface supporting good contactless probing and assembly within a larger package (such as with a conductive epoxy). As a result, the stack forming the electrical contacts 110, 114 facilitates easier testing and use of the auto-focus lens 100.

In addition, the presence of the titanium layer 314 between the titanium nitride layer 312 and the aluminum copper layer 316 helps to prevent a reaction that can occur during a wet etch of the aluminum copper layer 316. Such a wet etch of the aluminum copper layer 316 could otherwise create a surface reaction that interferes with later dry etching of the titanium nitride layer 312. The titanium layer 314 helps to avoid this problem, allowing dry etching of the titanium nitride layer 312 (and the titanium layer 314) to proceed more easily.

Finally, the thickness of the AlCu/Ti/TiN stack can be selected to help improve step-coverage of the stack over the underlying device topology. The exact thickness of each metal layer 312-316 in the stack, as well as the total thickness of the stack, can be determined in any suitable manner.

Each of the metal layers 312-316 shown in FIG. 3 could be formed in any suitable manner, such as deposition followed by one or more etch processes. In particular embodiments, after the metal layers 312-316 are deposited, a photoresist material could be deposited and patterned over the stack, and a wet etch could be used to etch through the aluminum copper layer 316. A dry etch (such as the dry plasma etch described below) could be used to etch through the titanium layer 314 and the titanium nitride layer 312, where the wet-etched aluminum copper layer 316 acts as a hardmask during the dry etch.

Although FIGS. 1 through 3 illustrate one example of an auto-focus lens 100 and related details, various changes may be made to FIGS. 1 through 3. For example, the size, shape, and number of each component and the arrangement of components in the auto-focus lens 100 are for illustration only and can vary as needed or desired. Also, the relative sizes and thicknesses of the various layers shown in FIG. 3 can vary as needed or desired.

Figure 4:
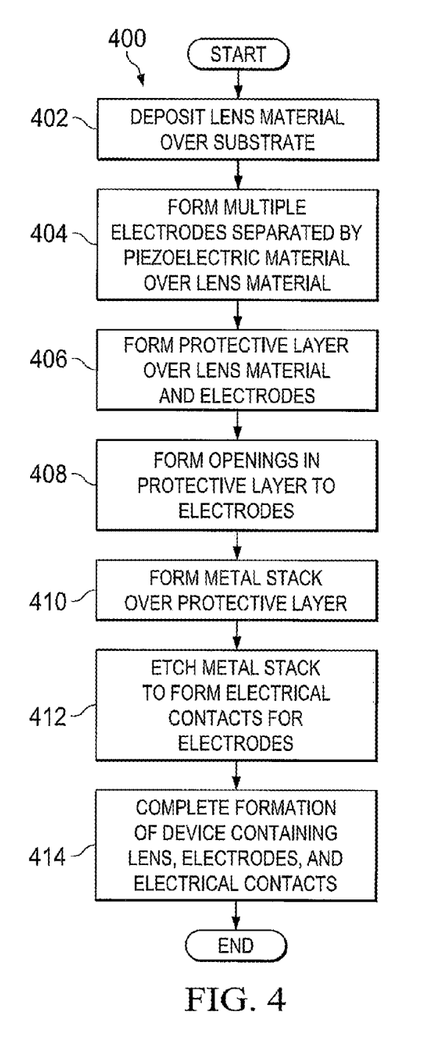
FIG. 4 illustrates an example method for bond-pad integration in an auto-focus lens or other device in accordance with this disclosure.

FIG. 4 illustrates an example method 400 for bond-pad integration in an auto-focus lens or other device in accordance with this disclosure. For ease of explanation, the method 400 is described with respect to the auto-focus lens 100 of FIGS. 1 through 3. However, the method 400 could be used to support bond-pad integration in any other suitable device.

As shown in FIG. 4, lens material is deposited over a substrate at step 402, and multiple electrodes separated by a piezoelectric material are formed over the lens material at step 404. This could include, for example, depositing glass material (such as BPSG) or other lens material 102 over a silicon or other substrate 302. This could also include depositing platinum or other metal(s) over the lens material 102 to form the electrodes 104-106. The piezoelectric material, such as a layer 306 of PZT, separates the electrodes 104-106 from one another and is formed between formation of the electrode 104 and formation of the electrode 106. Note that a seeding layer 304 can be used to facilitate formation of the electrode 104 over the lens material 102.

A protective layer is formed over the lens material and the electrodes at step 406. This could include, for example, forming an ALD or other layer 308 of alumina or other material(s) over the lens material 102 and over the capacitive stack formed by the electrodes 104-106 and the piezoelectric layer 306. This could also include forming a protective layer 310 over the lens material 102 and over the capacitive stack formed by the electrodes 104-106 and the piezoelectric layer 306. The protective layer 310 could include a stack of two silicon dioxide layers separated by a silicon oxinitride layer.

Openings are formed through the protective layer to the electrodes at step 408. This could include, for example, depositing a photoresist material over the layers 308-310, patterning the photoresist material, and etching openings through the layers 308-310 to expose portions of the electrodes 104-106.

A metal stack is formed over the protective layer and in the openings through the protective layer at step 410. This could include, for example, depositing a titanium nitride layer 312 over the layers 308-310, depositing a titanium layer 314 over the titanium nitride layer 312, and depositing an aluminum copper layer 316 over the titanium layer 314.

The metal stack is etched to form electrical contacts to the electrodes at step 412. This could include, for example, depositing a photoresist material over the layers 312-316 and patterning the photoresist material. This could also include performing a wet etch to etch through the aluminum copper layer 316. This could further include performing a dry plasma etch to etch through the titanium layer 314 and the titanium nitride layer 312, where the remaining portion of the aluminum copper layer 316 acts as a hardmask during the dry plasma etch. The remaining portions of the layers 312-316 form the electrical contacts 110, 114.

Formation of an auto-focus lens or other structure is completed at step 414. This could include, for example, performing backend processing to remove at least part of the substrate 302 from the lens material 102, thereby forming a lens. This could also include electrically coupling the electrical contacts 110, 114 to bond pads 108, 112, such as by using conductive epoxy.

Although FIG. 4 illustrates one example of a method 400 for bond-pad integration in an auto-focus lens or other device, various changes may be made to FIG. 4. For example, while shown as a series of steps, various steps in FIG. 4 could overlap, occur in parallel, occur in a different order, or occur any number of times. Additional steps could also be added. For instance, prior to formation of the protective layer 310 and prior to formation of the electrical contacts 110, 114, the structure can undergo an anneal in nitrogen gas prior to an anneal in oxygen gas, which can help to reduce or prevent discharge defects from forming and electrode delamination from occurring in the auto-focus lens 100.

Figure 5:
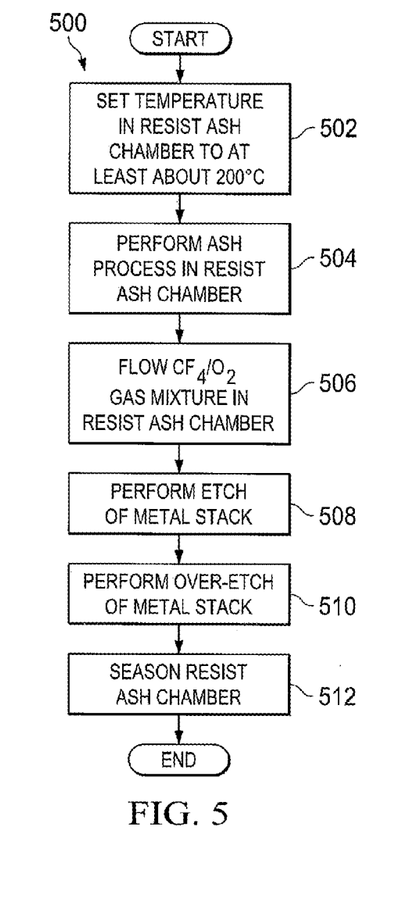
FIGS. 5 through 7 illustrate an example method for high-temperature isotropic plasma etching and related details in accordance with this disclosure.
Figure 6:
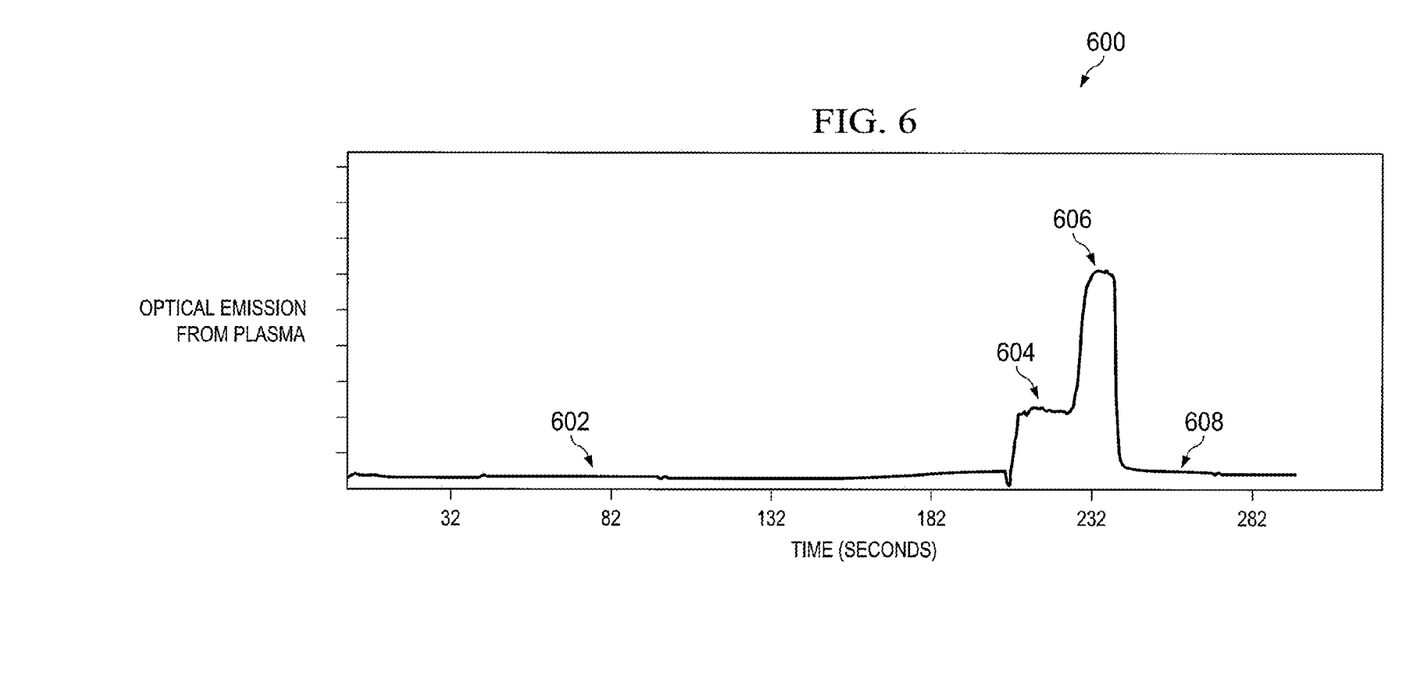
Figure 7:
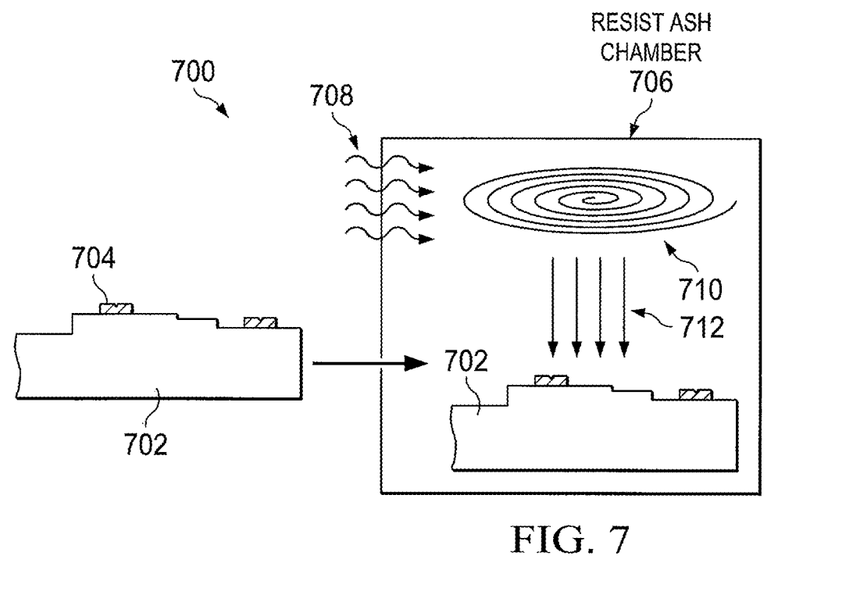

FIGS. 5 through 7 illustrate an example method for high-temperature isotropic plasma etching and related details in accordance with this disclosure. In particular, FIG. 5 illustrates an example method 500 for high-temperature isotropic plasma etching, FIG. 6 illustrates an example graph 600 identifying timings for different stages of the high-temperature isotropic plasma etching process, and FIG. 7 illustrates an example system 700 that can perform the high-temperature isotropic plasma etching process. The etching process described here can be used to help fabricate the auto-focus lens 100 of FIGS. 1 through 3. However, this etching process could also be used to fabricate other devices.

When etching metal stacks with a varying surface topology (such as the layers 312-316), one problem that can be encountered involves the presence of "stringers." Stringers represent conductive material that remains after an etching process used to etch a metal stack has been completed. With reference to FIG. 3, for example, when a conventional etching process is used, stringers 318 formed from titanium nitride residue could remain on vertical and horizontal surfaces of the protective layer 310. Given the design of the auto-focus lens 100 shown in FIG. 1, such stringers 318 could create an electrical short between adjacent bond pads 108, 112, which would effectively short the electrodes 104-106 together. Conventional Ti/TiN dry etch approaches cannot eliminate these types of TiN stringers 318. Moreover, chlorine-based plasma etching processes used to etch Ti/TiN layers could either (i) lack enough selectivity to avoid damaging the protective layer 310 or (ii) suffer from negative impacts caused by the wet etch typically used to etch through an AlCu layer. The high-temperature isotropic plasma etching process described with respect to FIGS. 5 through 7 can be used to etch through the titanium nitride layer 312 (and optionally the titanium layer 314) while substantially removing stringers (such as stringers 318).

As shown in FIGS. 5 and 6, the temperature within an interior of a resist ash chamber is set to a high temperature, such as to a temperature of about 200° C. or more, at step 502. An ash process is performed in the resist ash chamber at step 504. This could include, for example, placing a structure containing the substrate 302, the lens material 102, the electrodes 104-106, the piezoelectric layer 306, the layers 308-310, the metal layers 312-314, part of the metal layer 316, and photoresist material (among others) in a resist ash chamber. The photoresist material could represent the photoresist material used during a prior wet etch of the metal layer 316. The remaining part of the metal layer 316 can function as a hardmask during the high-temperature isotropic plasma etching process shown in FIG. 5. The ash process is represented in FIG. 6 as occurring during a time period 602.

Etching of a metal stack containing the layers 312-314 occurs during a series of steps 506-510. For example, a gas mixture is flowed within the resist ash chamber at step 506. The gas mixture includes tetrafluoromethane ($CF_4$) and oxygen gas ($O_2$) having a specified ratio, such as about 4:1 $CF_4$ to $O_2$. An etch of the metal stack occurs at step 508, and an over-etch of the metal stack occurs at step 510. This could include, for example, etching through the titanium layer 314 during a time period 604 and etching through the titanium nitride layer 312 during a time period 606. This could also include over-etching through the titanium nitride layer 312 and into the underlying protective layer 310 somewhat during a brief time period.

The resist ash chamber is seasoned during step 512. This could include, for example, flowing oxygen gas into the resist ash chamber during a time period 608. The oxygen gas is used to generate oxygen plasma, which helps to remove fluorine residue from the resist ash chamber. Among other things, the seasoning helps to provide process consistency in terms of (i) the TiN etch rate and (ii) the etch selectivity to the oxide in the protective layer 310 covering the central lens area of the device.

As shown in FIG. 7, a device 702 to be processed is provided with a mask 704. The device 702 could represent the structure containing the substrate 302, the lens material 102, the electrodes 104-106, the piezoelectric layer 306, the layers 308-310, and the metal layers 312-314. The mask 704 here could represent the remaining part of the metal layer 316 and possibly photoresist material. The mask 704 defines the locations where the electrical contacts 110, 114 are being formed.

The device 702 is placed inside a resist ash chamber 706. The resist ash chamber 706 denotes any suitable structure configured to perform an ashing process for integrated circuit devices, such as a LAM9600 DSQ ash chamber. Various gas flows 708 are provided to the resist ash chamber 706, and an RF coil 710 converts the gas flows 708 into plasma 712, which is used to etch the device 702. Gas flow rates, RF powers, temperatures, and other parameters within the resist ash chamber 706 can be controlled to implement the high-temperature isotropic plasma etching process described above.

In a particular implementation, the ash process performed during step 504 could occur within the resist ash chamber at a pressure of about 1200 meter-ton (mt) with an $O_2$ gas flow of about 900 standard cubic centimeters per minute (sccm) and a radio frequency (RF) power of about 1100 W to generate oxygen plasma. The etching process performed during steps 506-510 could occur within the resist ash chamber at a pressure between about 600 mt to about 1000 mt with a $CF_4$ gas flow of between about 100 sccm to about 200 sccm, an $O_2$ gas flow of about 40 sccm to about 60 sccm, and an RF power of about 450 W to about 600 W. As a particular example, the etching process performed during steps 506-510 could occur with a $CF_4$ gas flow of about 190 sccm, an $O_2$ gas flow of about 50 sccm, and an RF power of about 500 W. The chamber seasoning process during step 512 could occur within the resist ash chamber at a pressure of about 1200 mt with an $O_2$ gas flow of about 900 sccm and an RF power of about 1100 W to generate oxygen plasma.

The different time periods 602-608 shown in FIG. 6 could have the following lengths. The time period 602 for the ashing process could be about 210 seconds in length. The time periods 604-606 for the etching process could collectively be about 30 seconds in length. The time period 608 for the chamber seasoning process could be about 50 seconds in length. Note, however, that these values are examples only and can vary depending on a number of factors, including the thicknesses of the titanium and titanium nitride layers 312-314 to be etched.

Note that in conventional approaches, etching of the metal layers typically occurs first, and a photoresist layer used to mask the metal layers during etching is then ashed. However, when used with the AlCu/Ti/TiN metal stack described above, ashing the photoresist layer after etching is performed makes it difficult to remove the photoresist layer. The process shown in FIG. 5 reverses the ashing and etching steps and ashes the photoresist layer before etching, which facilitates easier removal of the photoresist layer.

The method 500 described above can be used to substantially remove titanium nitride from various sidewalls and other surfaces of the protective layer 310, such as on surfaces where there is a thick re-entrance profile due to the presence of a thick piezoelectric layer 306. This helps to reduce or eliminate the risk of electrical shorts between the bond pads 108, 112. At the same time, this approach can be used to obtain a consistent oxide loss in the protective layer 310 disposed over a lens aperture (the circular central portion of the auto-focus lens 100 in FIG. 1). This helps to increase the reliability of the auto-focus lens 100 while meeting desired optical transmission specifications.

Although FIGS. 5 through 7 illustrate one example of a method 500 for high-temperature isotropic plasma etching and related details, various changes may be made to FIGS. 5 through 7. For example, while shown as a series of steps, various steps in FIG. 5 could overlap, occur in parallel, occur in a different order, or occur any number of times. Also, the graph 600 shown in FIG. 6 is for illustration only and is meant merely to illustrate details of one example implementation of the method 500. In addition, the example system 700 shown in FIG. 7 is for illustration only.

Figure 8:
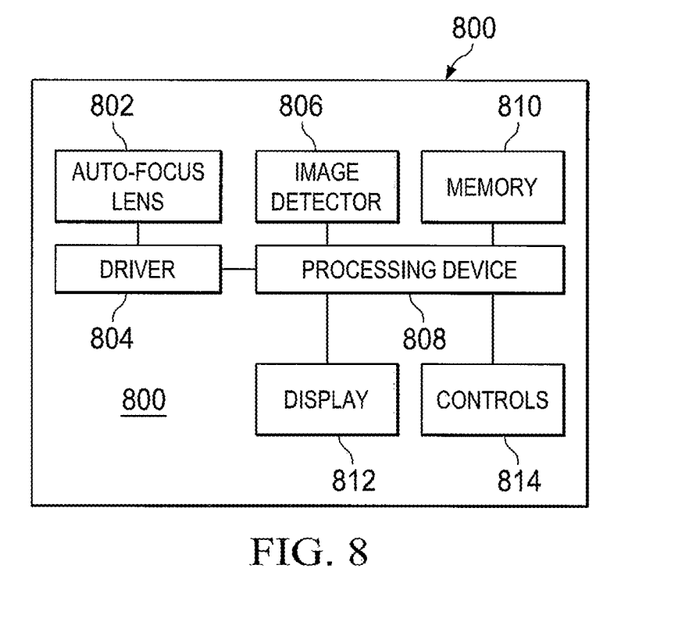
FIG. 8 illustrates an example device containing an auto-focus lens in accordance with this disclosure.

FIG. 8 illustrates an example device 800 containing an auto-focus lens 802 in accordance with this disclosure. The auto-focus lens 802 could, for example, represent the auto-focus lens 100 of FIGS. 1 through 3 fabricated as shown in FIGS. 4 through 7.

In FIG. 8, the auto-focus lens 802 is coupled to a driver 804. The driver 804 provides electrical signals to the auto-focus lens 802, thereby changing the focus of the auto-focus lens 802. For example, the driver 804 could provide a voltage across the electrodes 104-106 of the auto-focus lens via the bond pads 108, 112 and the electrical connections 110, 114. The voltage causes the piezoelectric layer 306 to change the shape of the lens material 102, altering the focus of the lens. The driver 804 includes any suitable structure for providing electrical signals (such as one or more voltages) to an auto-focus lens.

The device 800 also includes an image detector 806, at least one processing device 808, and at least one memory 810. The image detector 806 captures images obtained using light passing through the auto-focus lens 802. The image detector 806 represents any suitable structure for capturing images, such as a charge-coupled device (CCD), a complementary metal oxide semiconductor (CMOS) device, or a charge injection device (CID). In particular embodiments, the image detector 806 includes a two-dimensional array of detection elements, such as an array of monochrome or red-green-blue (RGB) detectors.

The processing device 808 performs various functions in the device 800, such as processing information from the image detector 806 to generate captured image files or controlling the driver 804 to alter the focus of the lens 802. The processing device 808 could perform any number of functions as needed or desired, such as functions typically associated with digital cameras or video recorders. Each processing device 808 includes any suitable processing or computing device, such as a microprocessor, microcontroller, digital signal processor (DSP), field programmable gate array (FPGA), application specific integrated circuit (ASIC), or discrete logic devices. The at least one memory 810 stores instructions and data used, generated, or collected by the device 800, such as captured images. Each memory 810 includes any suitable volatile or non-volatile storage and retrieval device, such as a random access memory (RAM) or a Flash or other read-only memory (ROM).

The device 800 also includes a display 812 and one or more controls 814. The display 812 can be used for various purposes, such as to allow a user to view captured images or prepare for new images to be captured. The display 812 could also present information to the user, such as information defining available or selected options or information describing captured images. If implemented as a touchscreen, the display 812 could further receive input from the user. The controls 814 can be used to trigger various functions (such as image captures), change various options of the device 800, and generally interact with the device 800. The display 812 includes any suitable structure for presenting images or information to a user, such as a liquid crystal display (LCD) or light emitting diode (LED) display. The controls 814 include any suitable structure(s) for receiving user input, such as one or more buttons, dials, or slides.

Although FIG. 8 illustrates one example of a device 800 containing an auto-focus lens 802, various changes may be made to FIG. 8. For example, while shown as being used as part of a camera or video recorder, the auto-focus lens 802 could be used with any other suitable device or system in which focusing of light using a lens is desired or required.

It may be advantageous to set forth definitions of certain words and phrases used throughout this patent document. Terms such as "over" or "under," when used with reference to components of a semiconductor device or integrated circuit, refer to relative positions of those components when viewed in particular orientations, but these terms do not require direct contact of those components. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   first and second electrodes separated by an insulative material;

a protective layer over the first and second electrodes, the protective layer having a first opening that exposes a portion of the first electrode and a second opening that exposes a portion of the second electrode;

a first electrical contact at least partially within the first opening and electrically coupled to the first electrode; and a second electrical contact at least partially within the second opening and electrically coupled to the second electrode;

wherein each of the first and second electrical contacts comprises a stack of metal layers, the stack of metal layers comprising a titanium nitride layer, a titanium layer over the titanium nitride layer, and an aluminum copper layer over the titanium nitride layer and the titanium layer.

2. The apparatus of claim 1, wherein:

the apparatus further comprises a lens material forming a lens; and the insulative material comprises a piezoelectric material configured to change a shape of the lens material in response to a voltage across the first and second electrodes to thereby change a focus of the lens.

3. The apparatus of claim 1, further comprising:

a first bond pad electrically coupled to the first electrical contact; and a second bond pad electrically coupled to the second electrical contact.

4. The apparatus of claim 3, wherein:

the first bond pad resides within a first window through the first electrode; and the second bond pad resides within a second window through the first electrode.

5. The apparatus of claim 1, wherein the first and second electrodes comprise platinum.

6. The apparatus of claim 1, wherein the insulative material comprises lead zirconium titanate.

7. The apparatus of claim 1, wherein, in each of the first and second electrical contacts:

the titanium nitride layer is configured to substantially block moisture from reaching the insulative material through the first or second opening of the protective layer;

the aluminum copper layer is configured to provide an electrical surface through which the apparatus is electrically coupled to an external device; and the titanium layer substantially prevents a reaction involving the titanium nitride layer from occurring during a wet etch of the aluminum copper layer.

8. A system comprising:

an auto-focus lens comprising a lens material forming a lens; and a driver configured to change a shape of the lens material in order to change a focus of the lens;

wherein the auto-focus lens further comprises:

first and second electrodes separated by an insulative piezoelectric material, the insulative piezoelectric material configured to change the shape of the lens material in response to a voltage across the first and second electrodes;

a protective layer over the lens material and over the first and second electrodes, the protective layer having a first opening that exposes a portion of the first electrode and a second opening that exposes a portion of the second electrode;

a first electrical contact at least partially within the first opening and electrically coupled to the first electrode and to the driver; and a second electrical contact at least partially within the second opening and electrically coupled to the second electrode and to the driver;

wherein each of the first and second electrical contacts comprises a stack of metal layers, the stack of metal layers comprising a titanium nitride layer, a titanium layer over the titanium nitride layer, and an aluminum copper layer over the titanium nitride layer and the titanium layer.

9. The system of claim 8, wherein:

the lens further comprises a first bond pad electrically coupled to the first electrical contact and a second bond pad electrically coupled to the second electrical contact; and the "first bond pad and the second bond pad" electrically couple the auto-focus lens to the driver.

10. The system of claim 9, wherein:

the first bond pad resides within a first window through the first electrode; and the second bond pad resides within a second window through the first electrode.

11. The system of claim 8, wherein the first and second electrodes comprise platinum.

12. The system of claim 8, wherein the insulative piezoelectric material comprises lead zirconium titanate.

13. The system of claim 8, wherein in each of the first and second electrical contacts:

the titanium nitride layer is configured to substantially block moisture from reaching the insulative material through the first or second opening of the protective layer;

the aluminum copper layer is configured to provide an electrical surface through which the apparatus is electrically coupled to an external device; and the titanium layer substantially prevents a reaction involving the titanium nitride layer from occurring during a wet etch of the aluminum copper layer.

14. The system of claim 8, further comprising:

an image detector configured to capture images using light that passes through the auto-focus lens.

15. The system of claim 14, further comprising:

at least one processing device configured to process information generated by the image detector to create image files; and at least one memory configured to store the image files.

16. A method comprising:

forming a stack of metal layers over multiple electrodes and over a protective layer of a device, the protective layer having a first opening that exposes a portion of the first electrode and a second opening that exposes a portion of the second electrode; and etching the stack of metal layers to form (i) a first electrical contact at least partially within the first opening and electrically coupled to the first electrode and (ii) a second electrical contact at least partially within the second opening and electrically coupled to the second electrode;

wherein the stack of metal layers comprises a titanium nitride layer, a titanium layer over the titanium nitride layer, and an aluminum copper layer over the titanium nitride layer and the titanium layer.

17. The method of claim 16, wherein etching the stack of metal layers comprises:

performing a wet etch through the aluminum copper layer; and performing a dry plasma etch through the titanium layer and the titanium nitride layer.

18. The method of claim 16, further comprising:

depositing a lens material on a substrate;

forming the first electrode over the lens material, a piezoelectric layer over the first electrode, and the second electrode over the piezoelectric layer;

forming the protective layer over the lens material and over the first and second electrodes;

forming the first and second openings through the protective layer; and removing at least part of the substrate.

19. The method of claim 16, further comprising:

forming a first bond pad and electrically coupling the first bond pad to the first electrical contact; and forming a second bond pad and electrically coupling the second bond pad to the second electrical contact.

20. The method of claim 19, wherein:

the first bond pad resides within a first window through the first electrode; and the second bond pad resides within a second window through the first electrode.

\* \* \* \* \*